United States Patent
Hsieh et al.

(10) Patent No.: US 8,766,270 B2
(45) Date of Patent: Jul. 1, 2014

(54) PIXEL STRUCTURE AND MANUFACTURING METHOD THEREOF

(75) Inventors: Hsiu-Chun Hsieh, Hsinchu (TW);
Yi-Wei Chen, Hsinchu County (TW);
Ta-Wei Chiu, Changhua County (TW);
Chung-Tao Chen, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 308 days.

(21) Appl. No.: 13/004,034

(22) Filed: Jan. 11, 2011

(65) Prior Publication Data

US 2012/0049197 A1 Mar. 1, 2012

(30) Foreign Application Priority Data

Aug. 30, 2010 (TW) .............................. 99129120 A

(51) Int. Cl.
*H01L 27/14* (2006.01)
*H01L 29/04* (2006.01)
*H01L 29/10* (2006.01)
*H01L 21/00* (2006.01)
*H01L 27/12* (2006.01)

(52) U.S. Cl.
CPC ........ *H01L 27/1288* (2013.01); *H01L 27/1237* (2013.01)
USPC .................. 257/72; 257/71; 257/59; 257/61; 257/66; 438/34; 438/40; 438/154; 438/155

(58) Field of Classification Search
USPC ................... 257/59, 66, 72, 79–99, E21.411, 257/E21.412; 438/28, 34, 37, 40, 149–155
See application file for complete search history.

(56) References Cited

U.S. PATENT DOCUMENTS

| 5,595,923 | A | 1/1997 | Zhang et al. | |
|---|---|---|---|---|
| 7,407,853 | B2 | 8/2008 | Kaitoh et al. | |
| 7,602,452 | B2 * | 10/2009 | Kato et al. ...................... | 349/38 |
| 2003/0059986 | A1 | 3/2003 | Shibata | |
| 2004/0219721 | A1 * | 11/2004 | Shiraishi et al. .............. | 438/149 |
| 2005/0285197 | A1 * | 12/2005 | Park .............................. | 257/347 |
| 2006/0091397 | A1 * | 5/2006 | Akimoto et al. ................ | 257/72 |
| 2007/0296885 | A1 * | 12/2007 | Kim et al. ........................ | 349/46 |
| 2008/0067519 | A1 | 3/2008 | Sakurai et al. | |
| 2008/0283840 | A1 * | 11/2008 | Doi et al. ........................ | 257/66 |

\* cited by examiner

*Primary Examiner* — Chuong A Luu
*Assistant Examiner* — Cory Eskridge
(74) *Attorney, Agent, or Firm* — Jianq Chyun IP Office

(57) ABSTRACT

A pixel structure is provided. A first insulating pattern is on the first polysilicon pattern. A second insulating pattern is on the second polysilicon pattern and separated from the first insulating pattern. An insulating layer covers the first and the second insulating patterns. A first gate and a second gate are on the insulating layer. A first covering layer covers the first and the second gates. A first source metal layer and a first drain metal layer are on the first covering layer and electrically connected to a first source region and a first drain region. A second source metal layer and a second drain metal layer are on the first covering layer and electrically connected to a second source region and a second drain region. A pixel electrode is electrically connected to the first drain metal layer.

15 Claims, 10 Drawing Sheets

PIXEL STRUCTURE AND MANUFACTURING METHOD THEREOF

CROSS-REFERENCE TO RELATED APPLICATION

This application claims the priority benefit of Taiwan application serial no. 99129120, filed on Aug. 30, 2010. The entirety of the above-mentioned patent application is hereby incorporated by reference herein and made a part of this specification.

BACKGROUND OF THE INVENTION

1. Field of the Invention

The invention relates to a pixel structure and a manufacturing method thereof. More particularly, the invention relates to a pixel structure having a polysilicon thin film transistor (TFT) and a manufacturing method of the pixel structure.

2. Description of Related Art

A TFT is a driving element applicable to a display. Among the TFTs, a low temperature polysilicon (LTPS) TFT is an element different from the conventional amorphous silicon TFT. Since the electron mobility of the LTPS-TFT can reach 200 $cm^2$/V-sec or more, TFTs with small dimension can be fabricated, and the aperture ratio can then be increased. Furthermore, the luminosity of the display device is increased, and the power consumption is reduced.

In a normal polysilicon TFT, a channel region, a source region, and a drain region are formed in an island-like polysilicon pattern. The island-like polysilicon pattern is covered by a gate insulating layer, and a gate is then formed on the gate insulating layer. Wherein the gate insulating layer within a uniformly thickness. The island-like polysilicon pattern has a certain height (i.e., a certain thickness), and therefore the gate insulating layer may have undesired step coverage due to the height of side walls of the island-like polysilicon pattern. As such, current leakage may occur between the gate and the island-like polysilicon pattern.

SUMMARY OF THE INVENTION

The invention is directed to a pixel structure and a manufacturing method thereof to resolve an issue of current leakage between an island-like polysilicon pattern and a gate of a polysilicon TFT in the pixel structure.

The invention provides a pixel structure that includes a substrate, a first polysilicon pattern, a first insulating pattern, a second polysilicon pattern, a second insulating pattern, an insulating layer, a first gate, a second gate, a first covering layer, a first source metal layer, a first drain metal layer, a second source metal layer, a second drain metal layer, a second covering layer, and a pixel electrode. The substrate has a first device region and a second device region. The first polysilicon pattern is located in the first device region and has a first source region, a first drain region, and a first channel region. The first insulating pattern is located on the first polysilicon pattern. The second polysilicon pattern is located in the second device region and has a second source region, a second drain region, and a second channel region. The second insulating pattern is located on the second polysilicon pattern, and the first insulating pattern is separated from the second insulating pattern. The insulating layer covers the first and the second insulating patterns. The first gate is located on the insulating layer above the first channel region. The second gate is located on the insulating layer above the second channel region. The first covering layer covers the first gate and the second gate. The first source metal layer and the first drain metal layer are located on the first covering layer and electrically connected to the first source region and the first drain region, respectively. The second source metal layer and the second drain metal layer are located on the first covering layer and electrically connected to the second source region and the second drain region, respectively. The second covering layer covers the first source metal layer, the first drain metal layer, the second source metal layer, and the second drain metal layer. The pixel electrode is located on the second covering layer and electrically connected to the first drain metal layer.

The invention further provides a manufacturing method of a pixel structure. A substrate having a first device region and a second device region is provided. A polysilicon layer and an insulating material layer are sequentially formed on the substrate. The insulating material layer and the polysilicon layer are simultaneously patterned to form a first polysilicon pattern and a first insulating pattern in the first device region and form a second polysilicon pattern and a second insulating pattern in the second device region. The first insulating pattern is separated from the second insulating pattern. A first source region, a first drain region, and a first channel region are formed in the first polysilicon pattern. A second source region, a second drain region, and a second channel region are formed in the second polysilicon pattern. An insulating layer is formed to cover the first and the second insulating patterns. A first gate is formed on the insulating layer above the first channel region. A second gate is formed on the insulating layer above the second channel region. A first covering layer is formed to cover the first gate and the second gate. A first source metal layer and a first drain metal layer are formed on the first covering layer and electrically connected to the first source region and the first drain region, respectively. A second source metal layer and a second drain metal layer are formed on the first covering layer and electrically connected to the second source region and the second drain region, respectively. A second covering layer is formed to cover the first source metal layer, the first drain metal layer, the second source metal layer, and the second drain metal layer. A pixel electrode is formed on the second covering layer. The pixel electrode is electrically connected to the first drain metal layer.

Based on the above, the first insulating pattern on the first polysilicon pattern is separated from the second insulating pattern on the second polysilicon pattern, and the first insulating pattern and the second insulating pattern are covered by another insulating layer. By employing said structure, current leakage between the gates and the polysilicon patterns is less likely to occur.

In order to make the aforementioned and other features and advantages of the invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1A:
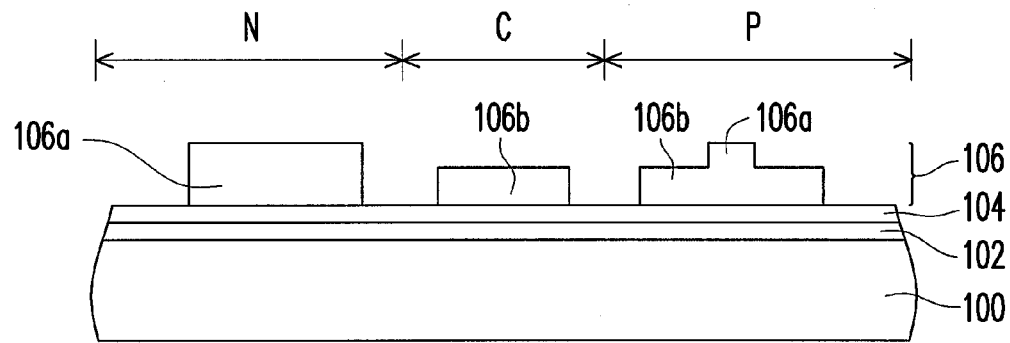
FIG. 1A to FIG. 1H are schematic cross-sectional flowcharts depicting a manufacturing process of a pixel structure according to an embodiment of the invention.

FIG. 1A to FIG. 1H are schematic cross-sectional flowcharts depicting a manufacturing process of a pixel structure according to an embodiment of the invention. With reference to FIG. 1A, a substrate 100 is provided. The substrate 100 is mainly adopted to carry devices and can be made of glass, quartz, organic polymer, metal, and so on. The substrate 100 has a first device region N and a second device region P. According to an embodiment of the invention, the substrate 100 selectively includes a capacitor region C. In this embodiment, the substrate 100 has the capacitor region C, which is however not limited in this invention. Namely, the capacitor region C may not exist in other embodiments of the invention. In this embodiment, an active device that is subsequently formed in the first device region N is an N-type polysilicon TFT, and an active device that is subsequently formed in the second device region P is a P-type polysilicon TFT, for instance.

A polysilicon layer 102 and an insulating material layer 104 are sequentially formed on the substrate 100. The polysilicon layer 102, for example, is formed by depositing an amorphous silicon material layer and performing a laser annealing process on the amorphous silicon material layer, such that the amorphous silicon material layer is transformed into the polysilicon layer. The insulating material layer 104 is formed by chemical vapor deposition or physical vapor deposition, for instance. Besides, the insulating material layer 104 can be made of silicon oxide, silicon nitride, silicon oxynitride, or any other appropriate material.

A patterned photoresist layer 106 is formed on the insulating material layer 104. The patterned photoresist layer 106 has a first photoresist pattern 106a and a second photoresist pattern 106b, and the first photoresist pattern 106a is substantially thicker than the second photoresist pattern 106b. In the first device region N, the insulating material layer 104 has the first photoresist pattern 106a thereon. In the second device region P, the insulating material layer 104 has the first and the second patterns 106a and 106b thereon, and the second photoresist pattern 106b is located at respective sides of the first photoresist pattern 106a. In the capacitor region C, the insulating layer 104 has the second photoresist pattern 106b thereon. The patterned photoresist layer 106, for example, is formed by coating a photoresist material layer and performing a photolithography process on the photoresist material layer with use of a gray-scale photo mask or a half-tone photo mask to pattern the photoresist material layer.

Figure 1B:
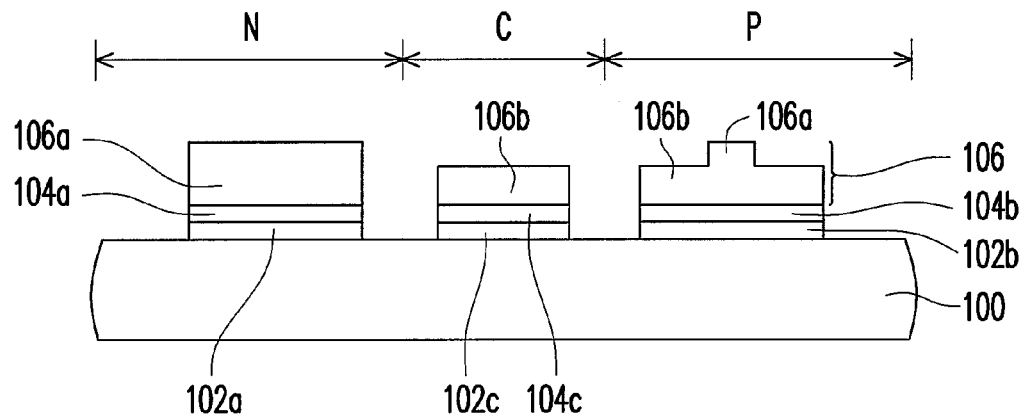

An etching process is performed on the polysilicon layer 102 and the insulating material layer 104 with use of the patterned photoresist layer 106 as an etching mask, so as to form a polysilicon pattern 102a and a first insulating pattern 104a in the first device region N, form a second polysilicon pattern 102a and a second insulating pattern 104b in the second device region P, and form a third polysilicon pattern 102c and a third insulating pattern 104c in the capacitor region C, as shown in FIG. 1B.

That is to say, in the above-mentioned patterning process (the etching process), the polysilicon layer 102 and the insulating material layer 104 are simultaneously patterned, so as to form the polysilicon pattern 102a and the first insulating pattern 104a in the first device region N, form the second polysilicon pattern 102a and the second insulating pattern 104b in the second device region P, and form the third polysilicon pattern 102c and the third insulating pattern 104c in the capacitor region C. Hence, after the patterning process is performed, the first insulating pattern 104a, the second insulating pattern 104b, and the third insulating pattern 104c are separated from one another.

Figure 1C:
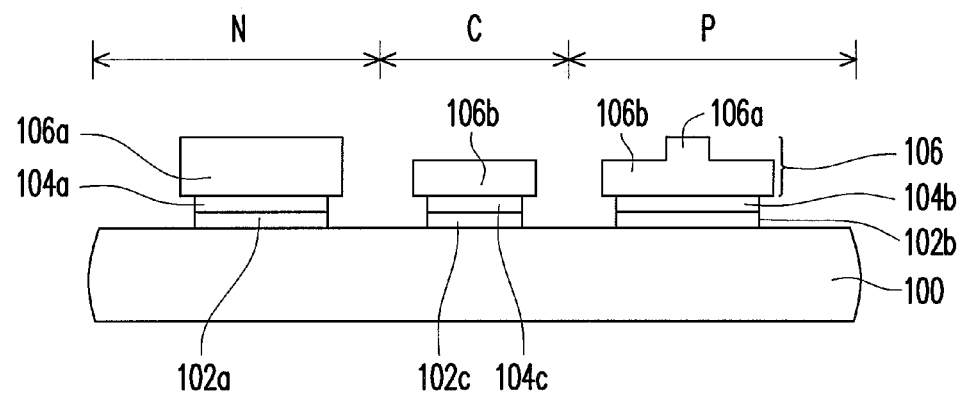

With reference to FIG. 1C, according to an embodiment of the invention, a lateral etching process can be further performed on the first polysilicon pattern 102a, the first insulating pattern 104a, the second polysilicon pattern 102b, the second insulating pattern 104b, the third polysilicon pattern 102c, and the third insulating pattern 104c after the patterning process (the etching process) is performed. In the lateral etching process, the patterned photoresist layer 106 protects or covers tops of the first insulating pattern 104a, the second insulating pattern 104b, and the third insulating pattern 104c, and side walls of the first polysilicon pattern 102a, the first insulating pattern 104a, the second polysilicon pattern 102b, the second insulating pattern 104b, the third polysilicon pattern 102c, and the third insulating pattern 104c are exposed. Accordingly, a portion of side walls of the first polysilicon pattern 102a, the first insulating pattern 104a, the second polysilicon pattern 102b, the second insulating pattern 104b, the third polysilicon pattern 102c, and the third insulating pattern 104c can be etched and removed, and the thickness of said side walls is reduced.

Figure 1D:
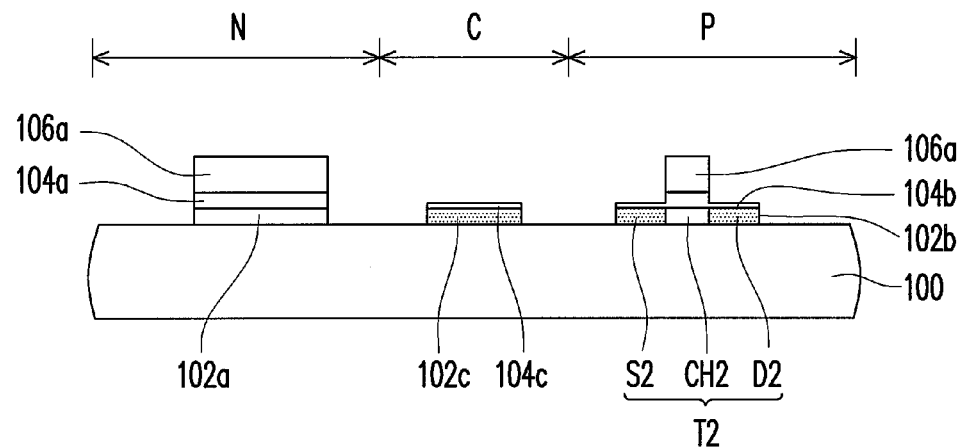

An ashing process is performed on the photoresist layer to remove a portion of the first photoresist layer 106a and the second photoresist pattern 106b of the patterned photoresist layer 106, such that a portion of the second insulating pattern 104b and a portion of the third insulating pattern 104c are exposed, as shown in FIG. 1D. An ion implantation process is performed to implant ions into the third polysilicon pattern 102c, and a second source region S2, a second drain region D2, and a second channel region CH2 of a second active device T2 are formed in the second polysilicon pattern 102b. In this embodiment, P-type ions are implanted in the ion implantation process. Therefore, after the ion implantation process is performed, the third polysilicon pattern 102c is doped with the P-type ions, and the second source region S2 and the second drain region D2 are P-type doped regions.

As indicated in FIG. 1D, when or after the second photoresist pattern 106b of the patterned photoresist layer 106 is removed, another etching treatment process can be further performed according to this embodiment. By implementing said etching treatment process, a portion of the second insulating pattern 104b above the second source region S2 and above the second drain region D2 can be removed, and a portion of the third insulating pattern 104c is removed. Namely, the thickness of the second insulating pattern 104b and the thickness of the third insulating pattern 104c are reduced. As such, the thickness of the third insulating pattern 104c and the thickness of the second insulating pattern 104b above the second source region S2 and above the second drain region D2 are both substantially smaller than the thickness of the first insulating pattern 104a.

Figure 1E:
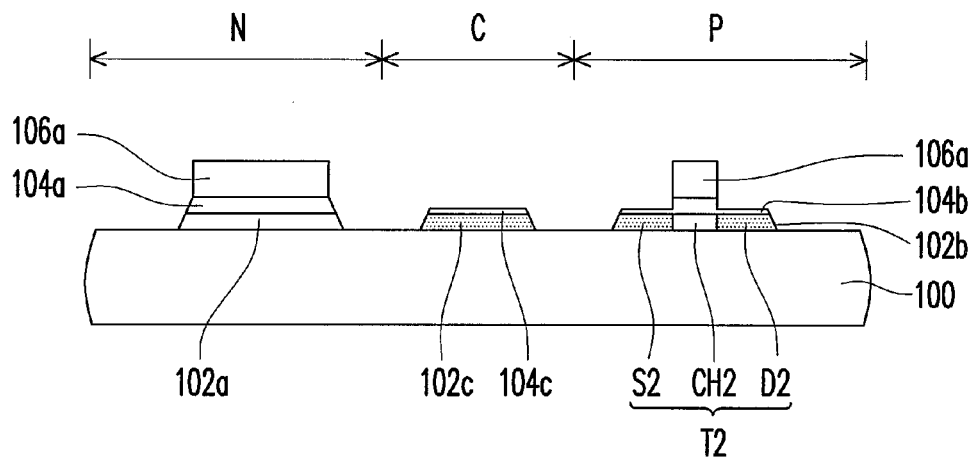

According to an embodiment of the invention, as shown in FIG. 1E, the first insulating pattern 104a and the first polysilicon pattern 102a on which the etching treatment process is performed can have gradient side walls, such that the second insulating pattern 104b and the second polysilicon pattern 102b have the gradient side walls, and that the third insulating pattern 104c and the third polysilicon pattern 102c have the gradient side walls. That is to say, the gradient side walls of the first insulating pattern 104a and the first polysilicon pattern 102a are not steep but gentle. Similarly, the gradient side walls of the second insulating pattern 104b and the second polysilicon pattern 102b are not steep but gentle. The gradient side walls of the third insulating pattern 104c and the third polysilicon pattern 102c are not steep but gentle.

Figure 1F:
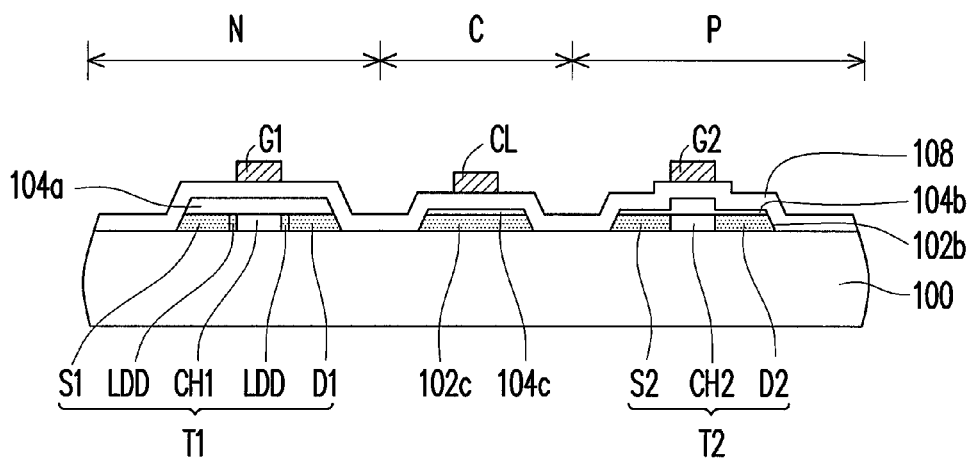

With reference to FIG. 1F, the first photoresist pattern 106a of the patterned photoresist layer is removed. An insulating layer 108 is formed on the substrate 100. The insulating layer 108 covers the first insulating pattern 104a, the second insulating pattern 104b, and the third insulating pattern 104c. The insulating layer 108 is formed by chemical vapor deposition or physical vapor deposition, for instance. Besides, the insulating layer 108 can be made of silicon oxide, silicon nitride, silicon oxynitride, or any other appropriate material. Note that the material of the insulating layer 108 can be substantially the same as or substantially different from the material of the first insulating pattern 104a, the material of the second insulating pattern 104b, and the material of the third insulating pattern 104c according to this embodiment. For instance, if the first insulating pattern 104a, the second insulating pattern 104b, and the third insulating pattern 104c are made of silicon oxide, the insulating layer 108 is made of silicon nitride. Alternatively, the first insulating pattern 104a, the second insulating pattern 104b, the third insulating pattern 104c, and the insulating layer 108 are all made of silicon nitride. The invention is not limited thereto.

A first gate G1 of a first active device T1 is formed on the insulating layer 108 in the first device region N, a second gate G2 of the second active device T2 is formed on the insulating layer 108 in the second device region P, and a capacitor electrode CL is formed on the insulating layer 108 in the capacitor region C. The first gate G1, the second gate G2, and the capacitor electrode CL are often made of metal. However, the first gate G1, the second gate G2, and the capacitor electrode CL can also be made of other conductive materials in other embodiments, which should not be construed as a limitation to the invention.

A first source region S1, a first drain region D1, and a first channel region CH1 of the first active device T1 are formed in the first polysilicon pattern 102a. According to this embodiment, the first source region S1 and the first drain region D1, for instance, are formed by performing an N-type ion implantation process, and therefore the first source region S1 and the first drain region D1 are N-type doped regions, respectively. A lightly doped drain region LDD can be further formed between the first source region S1 and the first channel region CH1 and between the first drain region D1 and the first channel region CH1 according to this embodiment.

Figure 1G:
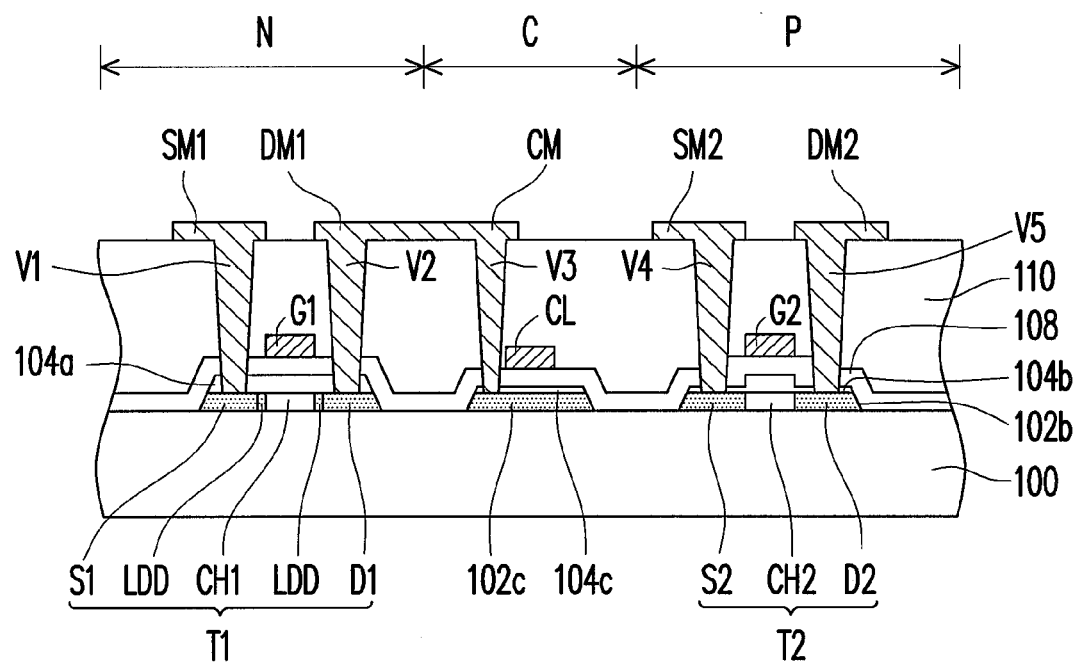

With reference to FIG. 1G, a first covering layer 110 is formed on the substrate 100 to cover the first gate G1, the second gate G2, and the capacitor electrode CL. The first covering layer 110 can be made of an inorganic material, an organic material, or any other appropriate material. A first source metal layer SM1 and a first drain metal layer DM1 are formed on the first covering layer 110 and electrically connected to the first source region S1 and the first drain region D1 through contact windows V1 and V2, respectively. A second source metal layer SM2 and a second drain metal layer DM2 are formed on the first covering layer 110 and electrically connected to the second source region S2 and the second drain region D2 through contact windows V4 and V5, respectively. Besides, a capacitor metal layer CM is further formed on the first covering layer 110. The capacitor metal layer CM is electrically connected to the first drain metal layer DM1, and the capacitor metal layer CM is electrically connected to the third polysilicon pattern 102c through a contact window V3.

Figure 3A:
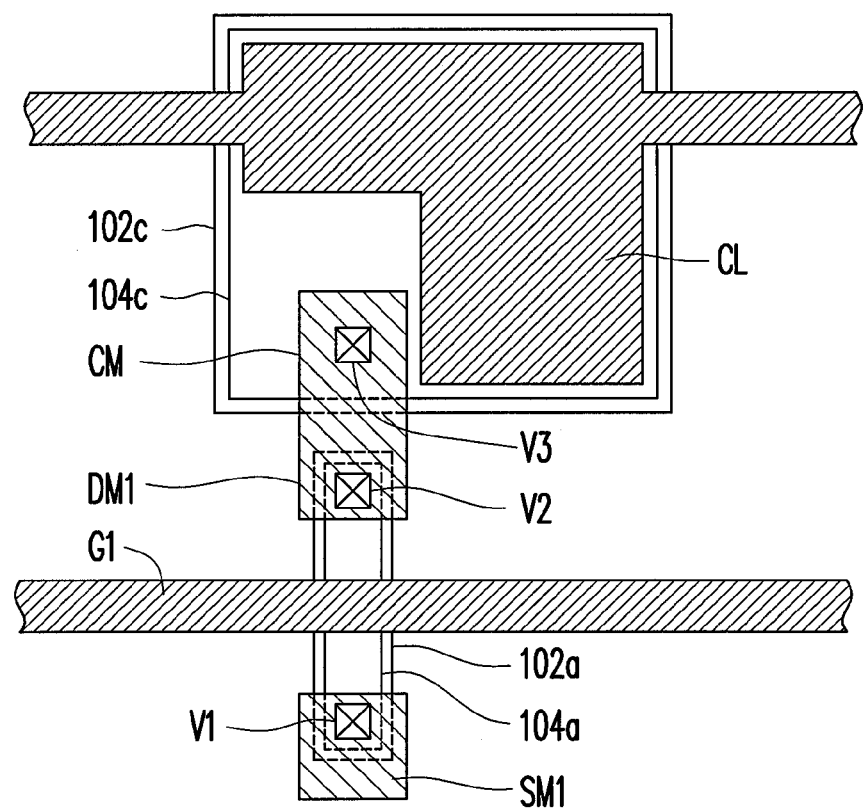
FIG. 3A is a schematic top view illustrating a first device region N and a capacitor region C correspondingly depicted in FIG. 1G.
Figure 3B:
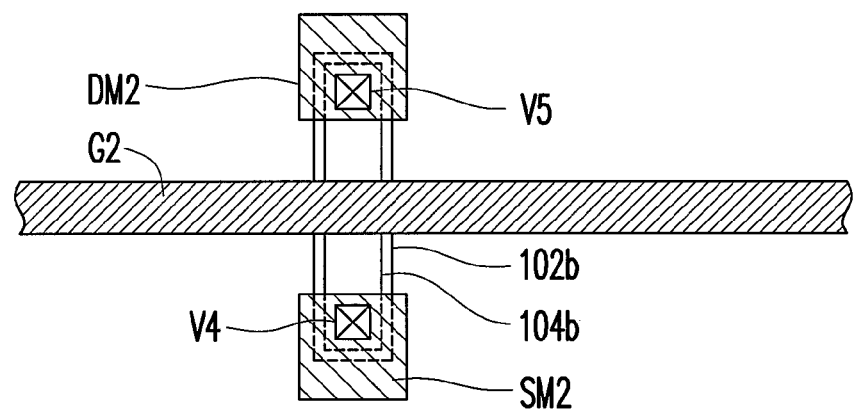
FIG. 3B is a schematic top view illustrating a second device region P correspondingly depicted in FIG. 1G.

FIG. 3A is a schematic top view illustrating the first device region N and the capacitor region C correspondingly depicted in FIG. 1G. FIG. 3B is a schematic top view illustrating the second device region P correspondingly depicted in FIG. 1G. Namely, after the step depicted in FIG. 1G is completed, the pixel structure is formed, and FIG. 3A and FIG. 3B are the top views of the pixel structure. With reference to FIG. 3A and FIG. 3B, the first insulating pattern 104a and the first polysilicon pattern 102a have the gradient side walls, and therefore the first polysilicon pattern 102a is not completely covered by the first insulating pattern 104a. That is to say, the first insulating pattern 104a exposes an edge of the first polysilicon pattern 102a. Similarly, the second insulating pattern 104b and the second polysilicon pattern 102b have the gradient side walls, and therefore the second polysilicon pattern 102b is not completely covered by the second insulating pattern 104b. That is to say, the second insulating pattern 104b exposes an edge of the second polysilicon pattern 102b. The third insulating pattern 104c and the third polysilicon pattern 102c have the gradient side walls, and therefore the third polysilicon pattern 102c is not completely covered by the third insulating pattern 104c. That is to say, the third insulating pattern 104c exposes an edge of the third polysilicon pattern 102c.

Figure 1H:
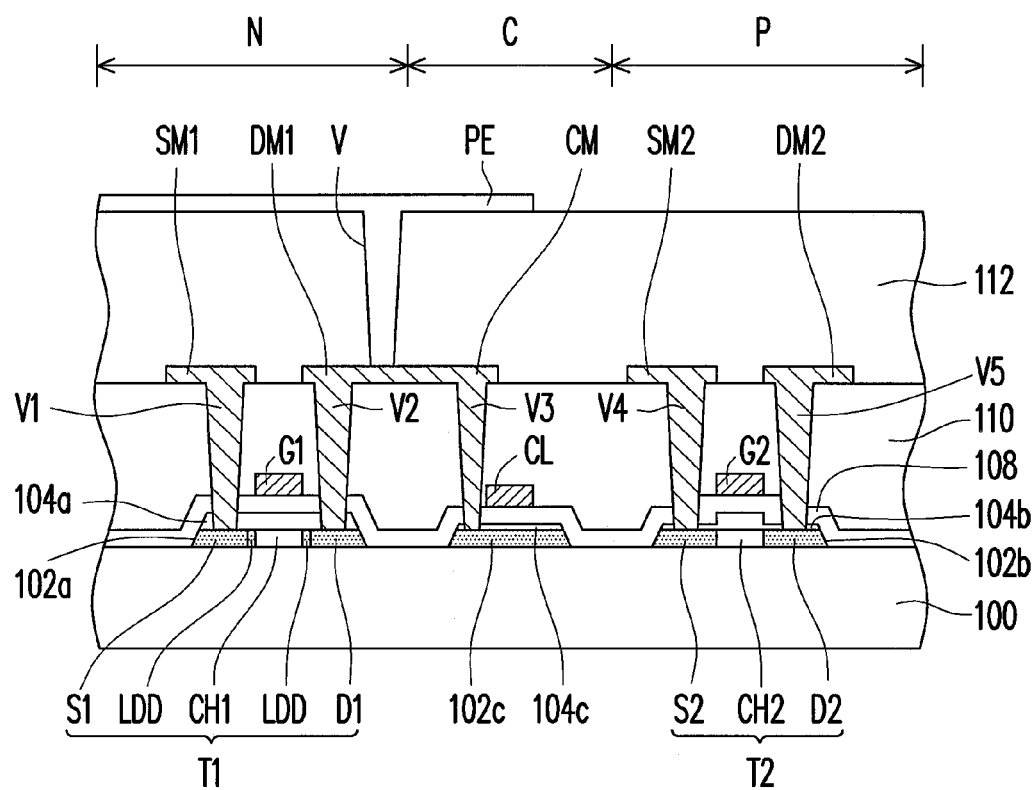

With reference to FIG. 1H, a second covering layer 112 is formed on the substrate 100 to cover the first source metal layer SM1, the first drain metal layer DM1, the second source metal layer SM2, the second drain metal layer DM2, and the capacitor metal layer CM. The second covering layer 112 can be made of an inorganic material, an organic material, or any other appropriate material. A pixel electrode PE is formed on the second covering layer 112 and electrically connected to the first drain metal layer DM1 through a contact window V. The pixel electrode PE can be a transparent pixel electrode, a reflective pixel electrode, or a transflective pixel electrode.

The pixel structure formed by applying the method depicted in the first embodiment is shown in FIG. 1H. Here, the pixel structure includes the substrate 100, the first polysilicon pattern 102a, the first insulating pattern 104a, the second polysilicon pattern 102b, the second insulating pattern 104b, the insulating layer 108, the first gate G1, the second gate G2, the first covering layer 110, the first source metal layer SM1, the first drain metal layer DM1, the second source metal layer SM2, the second drain metal layer DM2, the second covering layer 112, and the pixel electrode PE. According to an embodiment of the invention, the pixel structure can selectively include the third polysilicon pattern 102c, the third insulating pattern 104c, and the capacitor electrode CL.

The substrate 100 has the first device region N, the second device region P, and the capacitor region C.

The first polysilicon pattern 102a is located in the first device region N and has the first source region S1, the first drain region D1, and the first channel region CH1. The lightly doped drain region LDD can be located between the first source region S1 and the first channel region CH1 and between the first drain region D1 and the first channel region CH1 according to this embodiment. The first insulating pattern 104a is located on the first polysilicon pattern 102a. According to an embodiment of the invention, the first insulating pattern 104a and the first polysilicon pattern 102a together constitute a stacked layer and have the gradient side walls.

The second polysilicon pattern 102b is located in the second device region P and has the second source region S2, the second drain region D2, and the second channel region CH2. The second insulating layer 104b is located on the second polysilicon pattern 102b. According to an embodiment of the invention, the second insulating pattern 104b and the second polysilicon pattern 102b have the gradient side walls. Besides, in this embodiment, the second insulating layer 104b located above the second source region S2 and the second drain region D2 is substantially thinner than the second insulating layer 104b located above the second channel region CH2.

The third polysilicon pattern 102c is located in the capacitor region C, and the third insulating pattern 104c is located on the third polysilicon pattern 102c. Specifically, the third insulating pattern 104c, the second insulating pattern 104b, and the first insulating pattern 104a are separated from one another. According to an embodiment of the invention, the third insulating pattern 104c is substantially thinner than the first insulating pattern 104a. The thickness of the third insulating pattern 104c is approximately the same as the thickness of the second insulating pattern 104b located above the second source region S2 and the second drain region D2. However, the thickness of the third insulating pattern 104c is substantially smaller than the thickness of the second insulating pattern 104b located above the second channel region CH2.

The insulating layer 108 covers the first insulating pattern 104a, the second insulating pattern 104b, and the third insulating pattern 104c. The material of the insulating layer 108 can be the same as or different from the material of the first insulating pattern 104a, the material of the second insulating pattern 104b, and the material of the third insulating pattern 104c according to this embodiment.

The first gate G1 is located on the insulating layer 108 above the first channel region CH1. The second gate G2 is located on the insulating layer 108 above the second channel region CH2. The capacitor electrode CL is located on the insulating layer 108 above the third polysilicon pattern 102c.

The first covering layer 110 covers the first gate G1, the second gate G2, and the capacitor electrode CL.

The first source metal layer SM1 and the first drain metal layer DM1 are located on the first covering layer 110 and electrically connected to the first source region S1 and the first drain region D2 through contact windows V1 and V2, respectively. The second source metal layer SM2 and the second drain metal layer DM2 are located on the first covering layer 112 and electrically connected to the second source region S2 and the second drain region D2 through contact windows V4 and V5, respectively. Besides, the capacitor metal layer CM is further disposed on the first covering layer 110. The capacitor metal layer CM is electrically connected to the first drain metal layer DM1, and the capacitor metal layer CM is electrically connected to the third polysilicon pattern 102c through a contact window V3.

The second covering layer 112 covers the first source metal layer SM1, the first drain metal layer DM1, the second source metal layer SM2, the second drain metal layer DM2, and the capacitor metal layer CM.

The pixel electrode PE is located on the second covering layer 112 and electrically connected to the first drain metal layer DM1 through the contact window V. Hence, the pixel electrode PE is electrically connected to the third polysilicon pattern 102c through the contact window V, the capacitor metal layer CM, and the contact window V3.

Second Embodiment

Figure 2A:
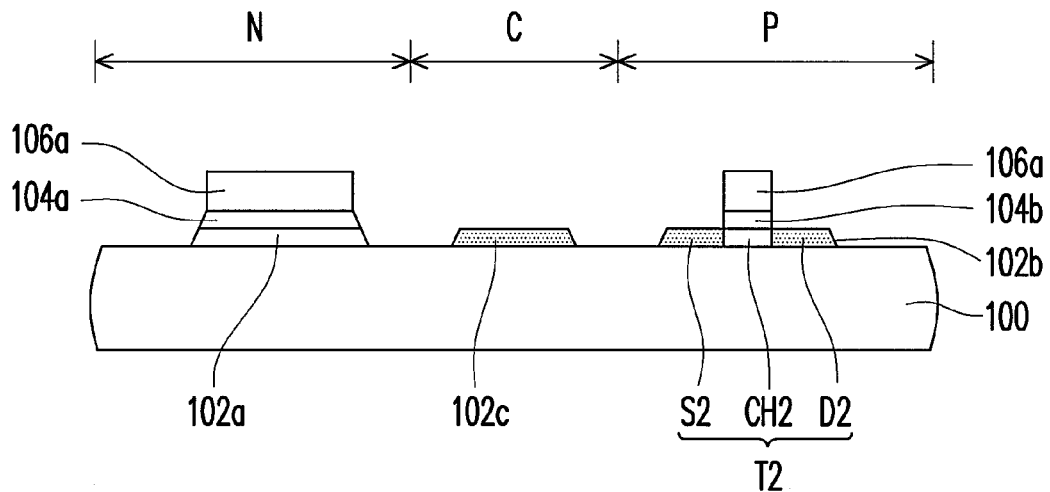
FIG. 2A to FIG. 2D are schematic cross-sectional flowcharts depicting a manufacturing process of a pixel structure according to another embodiment of the invention.

FIG. 2A to FIG. 2D are schematic cross-sectional flowcharts depicting a manufacturing process of a pixel structure according to another embodiment of the invention. The embodiment depicted in FIG. 2A to FIG. 2D is similar to the embodiment depicted in FIG. 1A to FIG. 1H, and therefore the same reference elements in this two embodiment are represented by the same reference number and will not be further described hereinafter. This embodiment depicted in FIG. 2A is similar to the first embodiment depicted in FIG. 1D, while the difference therebetween lies in that the etching process in this embodiment is performed to remove the third insulating pattern 104c and the second insulating pattern 104b located above the second source region S2 and the second drain region D2 when or after the second photoresist pattern 106b of the patterned photoresist layer 106 is removed. That is to say, in the embodiment depicted in FIG. 2A, the third polysilicon pattern 102c and the area above both the second source region S2 and the second drain region D2 are not covered by the insulating patterns.

Figure 2B:
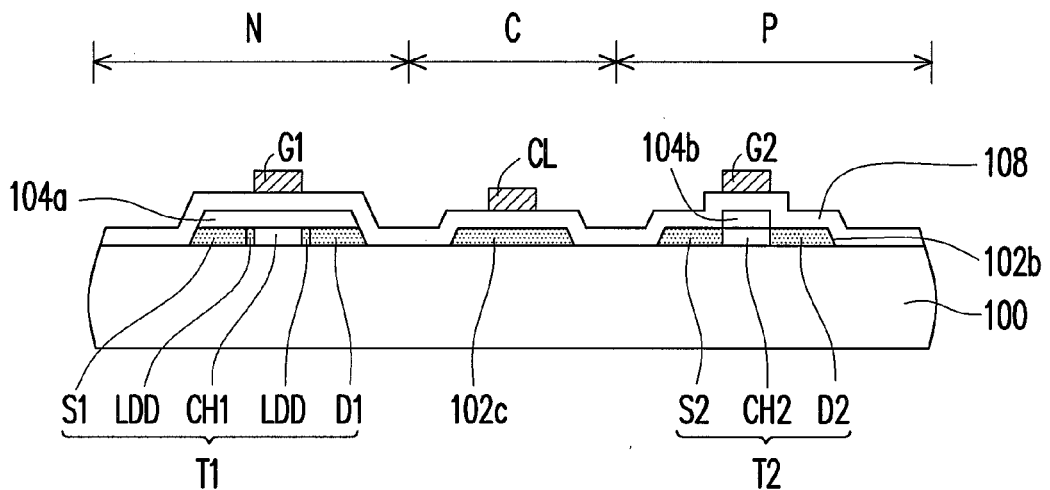

As shown in FIG. 2B, the insulating layer 108 directly covers the surface of the third polysilicon pattern 102c and the surfaces of the second source region S2 and the second drain region D2. Subsequent steps shown in FIG. 2C and FIG. 2D are identical or similar to those indicated in FIG. 1G and FIG. 1H.

Figure 2C:
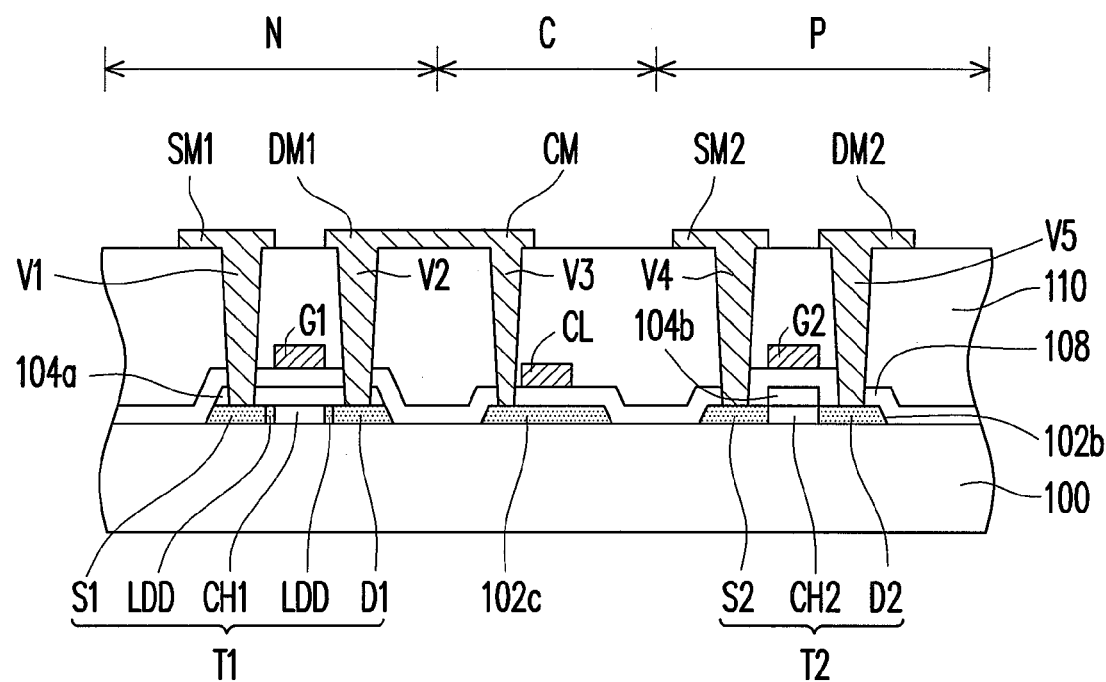
Figure 2D:
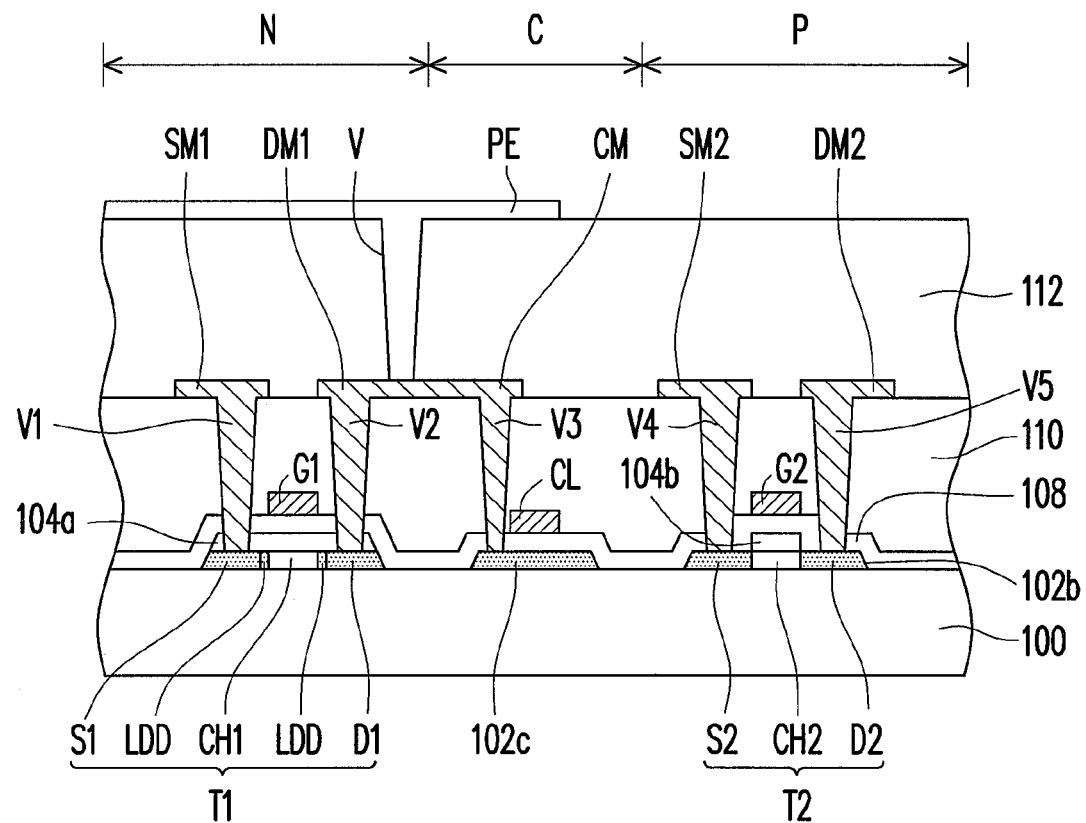
Figure 4A:
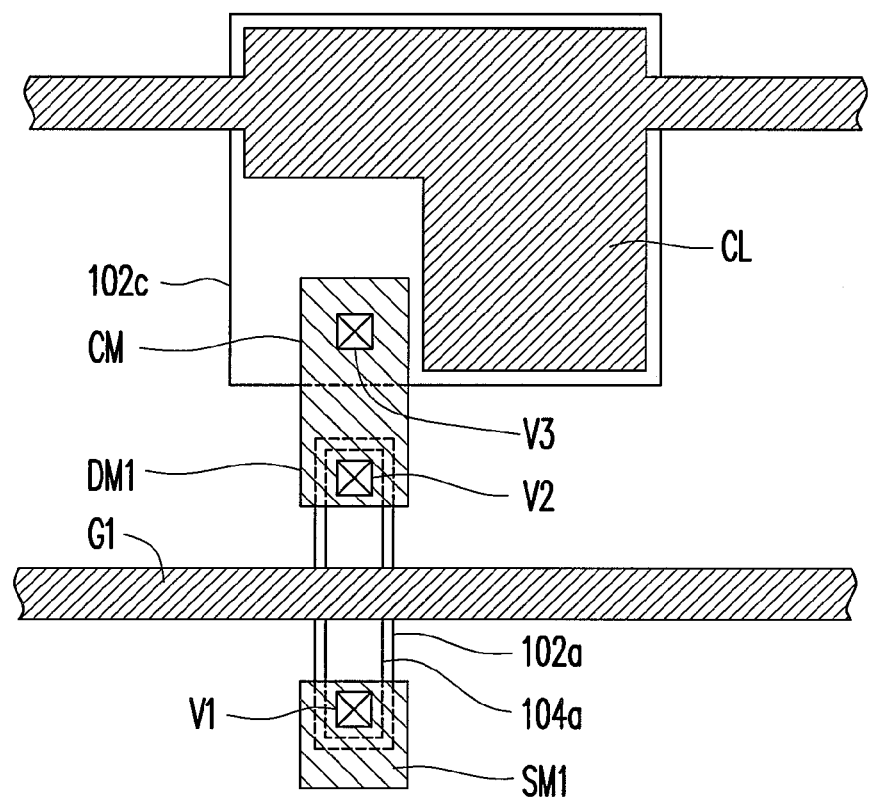
FIG. 4A is a schematic top view illustrating a first device region N and a capacitor region C correspondingly depicted in FIG. 2C.
Figure 4B:
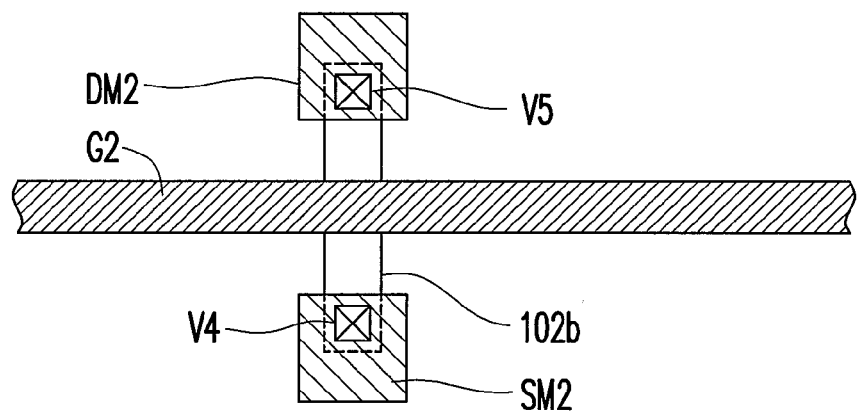
FIG. 4B is a schematic top view illustrating a second device region P correspondingly depicted in FIG. 2C.

FIG. 4A is a schematic top view illustrating the first device region N and the capacitor region C correspondingly depicted in FIG. 2C. FIG. 4B is a schematic top view illustrating the second device region P correspondingly depicted in FIG. 2C. Namely, after the step depicted in FIG. 2C is completed, the pixel structure is formed, and FIG. 4A and FIG. 4B are the top views of the pixel structure. With reference to FIG. 4A and FIG. 4B, the first insulating pattern 104a and the first polysilicon pattern 102a have the gradient side walls, and therefore the first polysilicon pattern 102a is not completely covered by the first insulating pattern 104a. That is to say, the first insulating pattern 104a exposes an edge of the first polysilicon pattern 102a. However, in this embodiment, the third insulating pattern 104c and the second insulating pattern 104b that is located above the second source region S2 and the second drain region D2 are removed. Accordingly, in FIG. 4A and FIG. 4B, the third polysilicon pattern 102c is not covered or concealed by the insulating patterns, and so is the second polysilicon pattern 102b located above the second source region S2 and the second drain region D2.

In light of the foregoing, the first insulating pattern on the first polysilicon pattern is separated from the second insulating pattern on the second polysilicon pattern, and the first insulating pattern and the second insulating pattern are covered by another insulating layer. In said structure, current leakage between the gates and the polysilicon patterns is less likely to occur.

Besides, the first polysilicon pattern and the first insulating pattern in the first active device of this invention have the gradient side walls, and the second polysilicon pattern and the second insulating pattern in the second active device of this invention have the gradient side walls as well. Hence, when the insulating layer is subsequently formed to cover the first and the second insulating patterns, favorable step coverage can be achieved. As such, satisfactory reliability of the first and the second active devices can be ensured.

It will be apparent to those skilled in the art that various modifications and variations can be made to the invention without departing from the scope or spirit of the invention. In view of the foregoing, it is intended that the disclosure cover modifications and variations of this invention provided they fall within the scope of the following claims and their equivalents.

What is claimed is:

1. A pixel structure comprising:
a substrate having a capacitor region, a first device region and a second device region;
a first polysilicon pattern located in the first device region and having a first source region, a first drain region, and a first channel region;
a first insulating pattern located on the first polysilicon pattern, wherein a thickness of the first insulating pattern located on the first source region, the first drain region and the first channel region is the same, wherein the first source region and the first drain region have N-type doping;
a second polysilicon pattern located in the second device region and having a second source region, a second drain region, and a second channel region;
a third polysilicon pattern located in the capacitor region;
a second insulating pattern located on the second polysilicon pattern, the first insulating pattern being separated from the second insulating pattern, wherein a thickness of the second insulating pattern located on the second channel region is greater than a thickness of the second insulating pattern located on the second source region and the second drain region, wherein the second source region and the second drain region have P-type doping;
a third insulating pattern located on the third polysilicon pattern, wherein a thickness of the third insulating pattern is smaller than the thickness of the second insulating pattern located on the second channel region and is smaller than the thickness of the first insulating pattern, and the third insulating pattern is separated from the second insulating pattern and the first insulating pattern, wherein the third polysilicon pattern has P-type doping;
insulating layer covering the first insulating pattern, the second insulating pattern and the third insulating pattern;
a first gate located on the insulating layer above the first channel region;
a second gate located on the insulating layer above the second channel region;
a capacitor electrode located on the insulating layer above the third polysilicon pattern;
a first covering layer covering the first gate and the second gate;
a first source metal layer and a first drain metal layer, located on the first covering layer and electrically connected to the first source region and the first drain region, respectively;
a second source metal layer and a second drain metal layer, located on the first covering layer and electrically connected to the second source region and the second drain region, respectively;
a second covering layer covering the first source metal layer, the first drain metal layer, the second source metal layer, and the second drain metal layer; and
a pixel electrode located on the second covering layer, electrically connected to the first drain metal layer, and electrically connected to the third polysilicon pattern.

2. The pixel structure as claimed in claim 1, wherein the first insulating pattern and the first polysilicon pattern together constitute a stacked layer, and the stacked layer has a gradient side wall.

3. The pixel structure as claimed in claim 1, wherein the second insulating pattern and the second polysilicon pattern have a gradient side wall.

4. The pixel structure as claimed in claim 1, wherein a material of the insulating layer is different from a material of the first insulating pattern and a material of the second insulating pattern.

5. The pixel structure as claimed in claim 1, wherein a material of the insulating layer is the same as a material of the first insulating pattern and a material of the second insulating pattern.

6. A manufacturing method of a pixel structure, comprising:
providing a substrate having a capacitor region, a first device region and a second device region;
sequentially forming a polysilicon layer and an insulating material layer on the substrate;
simultaneously patterning the insulating material layer and the polysilicon layer to form a first polysilicon pattern and a first insulating pattern in the first device region, form a second polysilicon pattern and a second insulating pattern in the second device region, and form a third polysilicon pattern and a third insulating pattern in the capacitor region, wherein the first insulating pattern, the second insulating pattern and the third insulating pattern are separated from each other;
forming a first source region, a first drain region, and a first channel region in the first polysilicon pattern, wherein a thickness of the first insulating pattern located on the first source region, the first drain region and the first channel region is the same, wherein the first source region and the first drain region have N-type doping;
forming a second source region, a second drain region, and a second channel region in the second polysilicon pattern, wherein a thickness of the second insulating pattern located on the second channel region is greater than a thickness of the second insulating pattern located on the second source region and the second drain region, and wherein a thickness of the third insulating pattern is smaller than the thickness of the second insulating pattern located on the second channel region and is smaller than the thickness of the first insulating pattern, wherein the second source region and the second drain region have P-type doping, and the third polysilicon pattern has P-type doping;
forming an insulating layer covering the first insulating pattern, the second insulating pattern and the third insulating pattern;
forming a first gate on the insulating layer above the first channel region;
forming a second gate on the insulating layer above the second channel region;
forming a capacitor electrode on the insulating layer above the third polysilicon pattern;
forming a first covering layer covering the first gate and the second gate;
forming a first source metal layer and a first drain metal layer on the first covering layer, the first source metal layer and the first drain metal layer being electrically connected to the first source region and the first drain region, respectively;
forming a second source metal layer and a second drain metal layer on the first covering layer, the second source metal layer and the second drain metal layer being electrically connected to the second source region and the second drain region, respectively;

forming a second covering layer covering the first source metal layer, the first drain metal layer, the second source metal layer, and the second drain metal layer; and forming a pixel electrode on the second covering layer, the pixel electrode being electrically connected to the first drain metal layer and electrically connected to the third pilysilicon pattern.

7. The manufacturing method of the pixel structure as claimed in claim 6, wherein the step of patterning the insulating material layer and the polysilicon layer comprises:

forming a patterned photoresist layer on the insulating material layer, the patterned photoresist layer having a first photoresist pattern and a second photoresist pattern, wherein a thickness of the first photoresist pattern is substantially greater than a thickness of the second photoresist pattern; and performing an etching process by applying the patterned photoresist layer to form the first polysilicon pattern and the first insulating pattern in the first device region, form the second polysilicon pattern and the second insulating pattern in the second device region, and form the third polysilicon pattern and the third insulating pattern in the capacitor region.

8. The manufacturing method as claimed in claim 7, after performing the etching process, the method further comprising performing a lateral etching process on the first polysilicon pattern, the first insulating pattern, the second polysilicon pattern, the second insulating pattern, the third polysilicon pattern, and the third insulating pattern.

9. The manufacturing method as claimed in claim 8, after performing the lateral etching process, the method further comprising:

removing the second photoresist pattern of the patterned photoresist layer to expose a portion of the second insulating pattern and a portion of the third insulating pattern;

performing an ion implantation process to implant ions into the third polysilicon pattern and from the second source region, the second drain region, and the second channel region in the second polysilicon pattern; and removing the first photoresist pattern of the patterned photoresist layer.

10. The manufacturing method as claimed in claim 9, further comprising performing an etching treatment process when or after the second photoresist pattern of the patterned photoresist layer is removed, such that the first insulating pattern and the first polysilicon pattern have a gradient side wall respectively, and the second insulating pattern and the second polysilicon pattern have a gradient side wall respectively.

11. The manufacturing method as claimed in claim 10, wherein the etching treatment process further comprises removing a portion of the second insulating pattern above the second source region and the second drain region so as to reduce a thickness of the second insulating pattern.

12. The manufacturing method as claimed in claim 10, wherein the etching treatment process further comprises removing a portion of the third insulating pattern so as to reduce a thickness of the third insulating pattern.

13. The manufacturing method as claimed in claim 10, wherein the etching treatment process further comprises removing the third insulating pattern.

14. The manufacturing method as claimed in claim 6, wherein a material of the insulating layer is different from a material of the first insulating pattern and a material of the second insulating pattern.

15. The manufacturing method as claimed in claim 6, wherein a material of the insulating layer is the same as a material of the first insulating pattern and a material of the second insulating pattern.

* * * * *